(12) United States Patent
Grace et al.

(10) Patent No.: US 7,717,599 B2
(45) Date of Patent: May 18, 2010

(54) INTEGRATING LIGHT SOURCE MODULE

(75) Inventors: Jennifer L. Grace, Lakeside Park, KY (US); Patrick R. Destain, Allen, TX (US); William E. Phillips, III, Cincinnati, OH (US)

(73) Assignee: 3M Innovative Properties Company, St. Paul, MN (US)

( * ) Notice: Subject to any disclaimer, the term of this patent is extended or adjusted under 35 U.S.C. 154(b) by 267 days.

(21) Appl. No.: 11/831,263

(22) Filed: Jul. 31, 2007

(65) Prior Publication Data

US 2008/0037271 A1  Feb. 14, 2008

Related U.S. Application Data

(60) Provisional application No. 60/838,988, filed on Aug. 21, 2006, provisional application No. 60/821,032, filed on Aug. 1, 2006, provisional application No. 60/820,888, filed on Jul. 31, 2006.

(51) Int. Cl.
*H01L 33/00* (2006.01)

(52) U.S. Cl. ............... 362/555; 362/318; 362/349; 362/551

(58) Field of Classification Search ........ 362/237, 362/241, 245, 318, 349, 551, 555
See application file for complete search history.

(56) References Cited

U.S. PATENT DOCUMENTS

| | | |
|---|---|---|
| 5,022,750 A | 6/1991 | Flasck |
| 5,084,807 A | 1/1992 | McKechnie et al. |
| 5,108,172 A | 4/1992 | Flasck |
| 5,335,158 A * | 8/1994 | Kaplan et al. ........ 362/303 |
| 5,592,578 A | 1/1997 | Ruh |
| 5,625,738 A | 4/1997 | Magarill |
| 5,882,774 A | 3/1999 | Jonza et al. |
| 5,962,114 A | 10/1999 | Jonza et al. |
| 6,091,085 A | 7/2000 | Lester |
| 6,200,002 B1 | 3/2001 | Marshall et al. |

(Continued)

FOREIGN PATENT DOCUMENTS

AU   2005/200510   2/2005

(Continued)

OTHER PUBLICATIONS

Hoelen, C. et al., "Multi-chip color variable LED spot modules", Proceedings of the SPIE, SPIR, Bellingham, VA, US, vol. 5941, Aug. 2, 2005, pp. 59410A-1.

(Continued)

*Primary Examiner*—Sandra L O'Shea
*Assistant Examiner*—Meghan K Dunwiddie (57) ABSTRACT

A light source module is provided comprising an emitter having at least one light emitting surface and an at least partially hollow integrating optic mounted over the emitting surface; where the index of refraction within the hollowed area is less then the index of the subsequent medium along the optical path. The integrating optic has a proximal end facing the emitting surface and a distal end facing away from the emitting surface. The distal end of the integrating optic is flat and has a rectangular aspect ratio which can differ from the aspect ratio of the emitter. One or more optical films and/or an optical component such as a collection lens can be adhered to the distal end of the integrating optic.

20 Claims, 7 Drawing Sheets

U.S. PATENT DOCUMENTS

| | | | |
|---|---|---|---|
| 6,204,523 B1 | 3/2001 | Carey et al. | |
| 6,246,446 B1 | 6/2001 | Heimbuch et al. | |
| 6,328,447 B1 | 12/2001 | Yamazaki et al. | |
| 6,337,536 B1 | 1/2002 | Matsubara et al. | |
| 6,486,499 B1 | 11/2002 | Krames et al. | |
| 6,527,411 B1 * | 3/2003 | Sayers | 362/245 |
| 6,590,235 B2 | 7/2003 | Carey et al. | |
| 6,609,795 B2 | 8/2003 | Weber et al. | |
| 6,719,426 B2 | 4/2004 | Magarill et al. | |
| 6,721,096 B2 | 4/2004 | Bruzzone et al. | |
| 6,772,265 B2 | 8/2004 | Baweja et al. | |
| 6,791,749 B2 | 9/2004 | DelPico et al. | |
| 6,793,344 B2 | 9/2004 | Kwok et al. | |
| 6,856,466 B2 | 2/2005 | Tocci | |
| 6,961,190 B1 | 11/2005 | Tamaoki et al. | |
| 7,046,338 B2 | 5/2006 | McGuire | |
| 7,059,728 B2 | 6/2006 | Alasaarela et al. | |
| 7,072,096 B2 | 7/2006 | Holman et al. | |
| 7,101,050 B2 | 9/2006 | Magarill et al. | |
| 7,133,211 B2 | 11/2006 | Kwok | |
| 7,168,820 B1 * | 1/2007 | Minassian | 362/101 |
| 2002/0024640 A1 | 2/2002 | Ioka | |
| 2002/0080622 A1 | 6/2002 | Pashley et al. | |
| 2002/0139984 A1 | 10/2002 | Sugawara et al. | |
| 2002/0180107 A1 | 12/2002 | Jackson et al. | |
| 2002/0190406 A1 | 12/2002 | Merrill et al. | |
| 2003/0048423 A1 | 3/2003 | Aastuen et al. | |
| 2003/0231497 A1 | 12/2003 | Sakata et al. | |
| 2004/0099992 A1 | 5/2004 | Merrill et al. | |
| 2004/0099993 A1 | 5/2004 | Jackson et al. | |
| 2004/0140765 A1 | 7/2004 | Takekuma | |
| 2004/0196518 A1 | 10/2004 | Wine et al. | |
| 2004/0218387 A1 | 11/2004 | Gerlach | |
| 2004/0227898 A1 | 11/2004 | Ma et al. | |
| 2004/0264185 A1 | 12/2004 | Grotsch et al. | |
| 2005/0023545 A1 | 2/2005 | Camras et al. | |
| 2005/0117366 A1 | 6/2005 | Simbal | |
| 2005/0135113 A1 | 6/2005 | Wang et al. | |
| 2005/0174771 A1 | 8/2005 | Conner | |
| 2005/0179041 A1 | 8/2005 | Harbers et al. | |
| 2006/0007538 A1 | 1/2006 | Robinson | |
| 2006/0022210 A1 | 2/2006 | Streubel | |
| 2006/0039140 A1 | 2/2006 | Magarill | |
| 2006/0083000 A1 | 4/2006 | Yoon et al. | |
| 2006/0091411 A1 | 5/2006 | Ouderkirk et al. | |
| 2006/0091784 A1 | 5/2006 | Conner et al. | |
| 2006/0091798 A1 | 5/2006 | Ouderkirk et al. | |
| 2006/0092532 A1 | 5/2006 | Ouderkirk et al. | |
| 2006/0102914 A1 | 5/2006 | Smits et al. | |
| 2006/0124918 A1 | 6/2006 | Miller et al. | |
| 2006/0139580 A1 | 6/2006 | Conner | |
| 2006/0221305 A1 | 10/2006 | Magarill | |
| 2006/0232578 A1 | 10/2006 | Reinhorn | |
| 2006/0262282 A1 | 11/2006 | Magarill | |
| 2006/0262514 A1 | 11/2006 | Conner et al. | |
| 2007/0016199 A1 | 1/2007 | Boehm, Jr. et al. | |
| 2007/0023941 A1 | 2/2007 | Duncan et al. | |
| 2007/0024981 A1 | 2/2007 | Duncan et al. | |
| 2007/0030456 A1 | 2/2007 | Duncan et al. | |
| 2007/0085973 A1 | 4/2007 | Duncan et al. | |
| 2007/0152231 A1 | 7/2007 | Destain | |
| 2007/0153397 A1 | 7/2007 | Destain | |
| 2007/0153402 A1 | 7/2007 | Destain | |
| 2007/0188864 A1 | 8/2007 | Duncan et al. | |
| 2007/0191506 A1 | 8/2007 | Lu et al. | |

FOREIGN PATENT DOCUMENTS

| | | |
|---|---|---|
| EP | 1363335 | 11/2003 |
| EP | 1387211 | 2/2004 |
| GB | 2 383 428 | 6/2003 |
| JP | 2006/067469 | 3/2007 |
| KR | 2005/065919 | 6/2005 |
| WO | WO 03/098916 | 11/2003 |
| WO | WO 2004/068602 | 8/2004 |
| WO | WO 2005/077002 | 8/2005 |
| WO | WO 2005/078496 | 8/2005 |
| WO | WO 2005/083804 | 9/2005 |
| WO | WO 2005/107420 | 11/2005 |
| WO | WO 2006/033032 | 3/2006 |
| WO | WO 2006/033245 | 3/2006 |
| WO | WO 2006/061763 | 6/2006 |
| WO | WO 2006/124993 | 11/2006 |
| WO | WO 2007/042711 | 4/2007 |

OTHER PUBLICATIONS

U.S. Appl. No. 60/820,894, filed Jul. 31, 2006.
U.S. Appl. No. 60/820,877, filed Jul. 31, 2006.
U.S. Appl. No. 60/820,883, filed Jul. 31, 2006.
U.S. Appl. No. 60/820,887, filed Jul. 31, 2006.
U.S. Appl. No. 60/820,888, filed Jul. 31, 2006.
U.S. Appl. No. 60/821,032, filed Aug. 1, 2006.
U.S. Appl. No. 60/838,988, filed Aug. 21, 2006.
U.S. Appl. No. 11/381,518, filed May 3, 2006.
U.S. Appl. No. 11/457,599, filed Jul. 14, 2006.
U.S. Appl. No. 11/772,609, filed Jul. 2, 2007.
U.S. Appl. No. 11/831,220, filed Jul. 31, 2007.
U.S. Appl. No. 11/831,307, filed Jul. 31, 2007.
U.S. Appl. No. 11/831,171, filed Jul. 31, 2007.
U.S. Appl. No. 11/831,198, filed Jul. 31, 2007.
U.S. Appl. No. 11/831,263, filed Jul. 31, 2007.
Data Management White Papers, silicon.com, http://whitepapers.silicon.com/0,39024759,60243129p-39000676q,00.htm, downloaded Jul. 13, 2007.
Destain, Patrick; Opcon Associates Inc., Description of the Mini-projection Optical design, Jan. 23, 2006.
DigiTimes daliy IT news, TI shows projection image for mobile phone, http://www.digitimes.com/NewsShow/MailHome.asp?datePublish=2007/3/27&pages=VL&seq=207, Mar. 28, 2007.
Zou, Hans et al.; 58.1: Single-Panel LCOS Color Projector with LED Light Sources, SID 05 Digest, pp. 1698-1701, 2005.
Lo, H, et al.; P-208: Novel Optical Design for Mini Projector, SID 06 Digest. pp. 1012-1014, 2006.
"TI Pushing DLP into Mobile Phase" http://www.dailytech.com/article.aspx?newsid=5671.
"Digismart Miniature Projection Technology" http://www.digislide.com.au/consumer/digismart.htm.

* cited by examiner

INTEGRATING LIGHT SOURCE MODULE

CROSS-REFERENCE TO RELATED APPLICATION

The present application is based on and claims the benefit of U.S. provisional patent application Ser. No. 60/838,988, filed Aug. 21, 2006, of U.S. provisional patent application Ser. No. 60/821,032, filed Aug. 1, 2006, and of U.S. provisional patent application Ser. No. 60/820,888, filed Jul. 31, 2006, the contents of which are hereby incorporated by reference in their entirety.

Reference is made to commonly assigned U.S. Patent Application entitled "LED Mosaic" Ser. No. 11/831,198, filed on even date herewith; U.S. Patent Application entitled "Combination Camera/Projector System" Ser. No. 11/831,220, filed on even date herewith; U.S. Patent Application entitled "LED Source With Hollow Collection Lens" Ser. No. 11/831,171, filed on even date herewith; U.S. patent application Ser. No. 11/322,801, "LED With Compound Encapsulant Lens", filed Dec. 30, 2005; U.S. Patent Application entitled "Optical Projection Subsystem" Ser. No. 11/557,540, filed on even date herewith; U.S. patent application Ser. No. 11/772,609 entitled "LED Illumination System With Polarization Recycling" filed on Jul. 2, 2007; and U.S. Patent Application Publications US2006/0091411 (Ouderkirk et al.) "High Brightness LED Package", US2006/0091798 (Ouderkirk et al.) "High Brightness LED Package With Compound Optical Element(s)", and US2006/0092532 (Ouderkirk et al.) "High Brightness LED Package With Multiple Optical Elements", all incorporated herein by reference.

BACKGROUND

Light source modules are most widely used in illumination systems which have a variety of applications, including projection displays, backlights for liquid crystal displays (LCDs) and others. Projection systems usually include a source of light, illumination optics, an image-forming device, projection optics and a projection screen. The illumination optics collect light from a light source and direct it to one or more image-forming devices in a predetermined manner. The image-forming devices, controlled by an electronically conditioned and processed digital video signal, produce an image corresponding to the video signal. Projection optics then magnify the image and project it onto the projection screen. White light sources, such as arc lamps, in conjunction with color wheels have been and still are predominantly used as light sources for projection display systems. However, recently, light emitting diodes (LEDs) were introduced as an alternative due to their longer lifetime, higher efficiency and superior thermal characteristics.

LEDs typically include an LED die or chip mounted on a metal header. The header can have a reflective cup in which the LED die is mounted, and electrical leads connected to the LED die. Some packages may also include a molded transparent resin that encapsulates the LED die. The encapsulating resin can have either a nominally hemispherical front surface to partially collimate light emitted from the die, or a nominally flat surface. Moreover, an optical element may be brought into contact or close proximity with a surface of an LED die to couple or "extract" light therefrom in order to reduce the amount of light trapped within the die.

Also, extraction structures can be formed or positioned on the LED emitter to help couple light out of the LED die, thereby preventing the light from being trapped therein and wasted. For example, roughening the emitting surface of the LED die or providing a large number of facets or other structures on such surface, such as sub-wavelength structure, can be used to enhance light extraction from the LED die. Other extraction structures include high extraction photonic crystal structures and wire grid extraction components. Still other extraction structures include glass or ceramic extractors or extractor arrays as disclosed in U.S. Patent Application Publications US2006/0091411 (Ouderkirk et al.) "High Brightness LED Package", US2006/0091798 (Ouderkirk et al.) "High Brightness LED Package With Compound Optical Element(s)", and US2006/0092532 (Ouderkirk et al.) "High Brightness LED Package With Multiple Optical Elements", all incorporated herein by reference.

Recent advances in solid state lighting, optics, and display elements are allowing the creation of extremely small, full-color projectors. In order to make these color projectors small enough to be incorporated into a cell phone, it is necessary to explore very efficient and compact means of combining colors. There are two predominant methods of creating color projection. The first method, known as "Color-Sequential," uses a dichroic X-cube to overlay light from individual red, green and blue light sources and image these colors onto a monochrome microdisplay in a specific time-sequential fashion. The second method, known as "Color-Filtering," entails imaging a white light source onto a microdisplay with red/green/blue color filters.

The discussion above is merely provided for general background information and is not intended to be used as an aid in determining the scope of the claimed subject matter.

SUMMARY

A light source module is provided comprising an emitter having at least one light emitting surface and an at least partially hollow integrating optic mounted over the emitting surface; where the index of refraction within the hollowed area is less then the index of the subsequent medium along the optical path. The integrating optic has a proximal end facing the emitting surface and a distal end facing away from the emitting surface. The distal end of the integrating optic is flat and has a rectangular aspect ratio which can differ from the aspect ratio of the emitter. Optical films and/or an optical component such as a collection lens can be adhered to the distal end of the integrating optic.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DETAILED DESCRIPTION

Disclosed embodiments provide, among other things, an efficient mechanism for extracting light from an LED light source. If desired, the disclosed embodiments can also be used for combining colors from LED emitters. These disclosed embodiments enable more compact versions of the Color-Sequential and Color-Filtering techniques by eliminating the need for the X-cube in the Color-Sequential method, and eliminating the need for anamorphic and Fresnel lenses, which have conventionally been used in both Color-Sequential and Color-Filtering methods of color projection.

Also, using some of the integrator rod/tunnel techniques disclosed herein, the use of LEDs having extraction structures on the surface of the die is possible without interfering with the intended light extracting function of those structures. Although extraction features are not shown in detail in the FIGS. of the present disclosure, each embodiment disclosed herein should be interpreted as optionally encompassing these features, though the features are not required.

The disclosed designs are in some ways contrary to contemporary teachings that the only way to increase the extraction efficiency of a high refractive index LED die or chip is to encapsulate it in a medium having the highest available refractive index, i.e., as close as possible to that of the LED die. A basic example of an LED light source employing this contemporary teaching is shown in prior art FIG. 1A of U.S. Patent Application entitled "Light Emitting Diodes with Improved Light Extraction Efficiency" (US 2002/0030194 A1). This illumination source includes an LED emitter in the form of a die or chip positioned on a metal header. Wire bonds provide electrical connection to the LED emitter. The emitter is bonded to a transparent optical element having a refractive index for light emitted by the active region preferably greater than about 1.5, more preferably greater than about 1.8.

As discussed, disclosed embodiments depart from conventional encapsulating techniques, and instead utilize a relatively low index medium or optic between the LED emitter and a subsequent optic. The benefits are similar to those described in the above reference U.S. Patent Application entitled "LED Source with Hollow Collection Lens", and in U.S. patent application Ser. No. 11/322,801, entitled "LED With Compound Encapsulant Lens," except that in the present disclosure the additional benefit of an integrating optic is also utilized.

Figure 1:
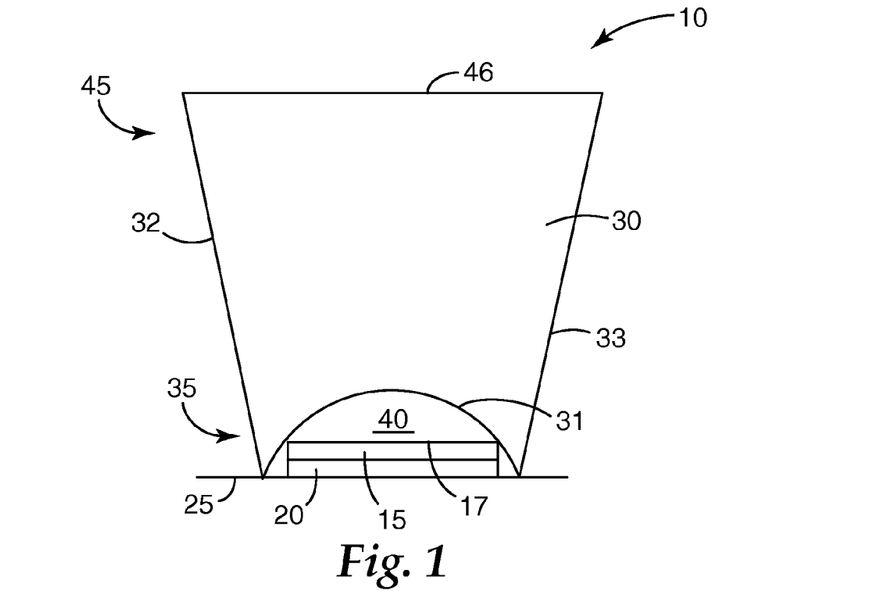
FIG. 1 is a schematic side view illustration of a light source module including a tapered rod integrator type of at least partially hollow integrating optic in accordance with some disclosed embodiments.

In one embodiment shown in FIG. 1, the integrating optic has a spherical cavity which provides the benefit of allowing room for wire bonds or other raised features on the surface of the LED, and also efficiently collects light from an LED having extracting features that work best with an air interface. It is often preferable to follow such air gaps with a spherical surface rather than a flat surface so as to minimize Fresnel losses, particularly for the light rays exiting the LED at very high angles. In this case minimal Fresnel losses occur for light ray incident at normal angles. Assuming the LED is a Lambertian emitter, more of the light rays exiting the die into air will be captured by a spherical surface since more of them will strike at angles close to normal.

Referring now to the drawings of the present disclosure, wherein like reference numbers designate similar elements, FIG. 1 shows schematically an exemplary embodiment of the illumination systems of the present disclosure, which may be used for projection applications. The light source module 10 shown in FIG. 1 includes an emitter 15 having an emitting surface 17. Emitting surface 17 which may be or may include an emitting surface or surfaces of an LED, a layer of phosphor, or any other emissive material. The emitter 15 is positioned on a mounting surface or substrate 25, and can optionally have a heat sink 20 positioned between the emitter 15 and the surface 25, or elsewhere. Although shown positioned between emitter 15 and surface 25, heat sink 20 is not required in all embodiments, nor is it necessary for the heat sink to be located in this particular position.

Figure 12:
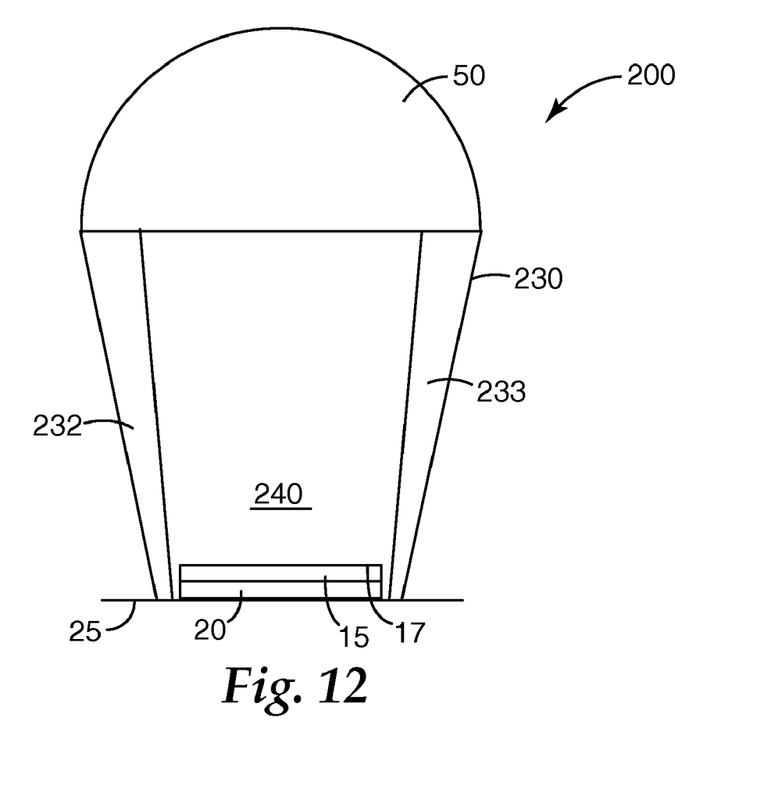
FIG. 12 is a schematic side view illustration of a light source module including a hollow integrating tunnel type of integrating optic in accordance with another disclosed embodiment.

Light source module 10 also includes an integrating optic 30 which is at least partially hollow mounted over emitting surface 17 of emitter 15. In this particular embodiment, integrating optic is a tapered rod integrator. Most examples described herein are with reference to tapered rod integrators 30 and 130 (described initially with reference to FIG. 7). However, these are only examples of integrating optics which are at least partially hollow, and other examples of such optics are also disclosed. For example, tunnel integrator 230 introduced in FIG. 12 is another such integrating optic. Although various features are described with reference to one type of integrating optic or another, it should be understood that these features can be present with any of the disclosed types of at least partially hollow integrating optics.

Referring back to FIG. 1, mounting of integrator 30 over emitting surface 17 can be through any desired technique or configuration, including by mounting integrator 30 to other surfaces (e.g., surface 25 or a surface of heat sink 20). Tapered rod integrator 30 has a proximal end 35 and a distal end 45. Proximal end 35 faces emitting surface 17, while distal end 45 faces away from the emitting surface. Proximal end 35 of integrator 30 provides a surface 31 that forms a spherical cavity 40 over emitter 15. Distal end 45 of integrator 30 provides a surface 46 on which optical components and/or films can be positioned. Between top surface 46 and bottom surface 31, integrator 30 has tapered sidewalls 32 and 33.

In exemplary embodiments, cavity 40 provided by tapered rod integrator is filled with a material having a refractive index, n1, which is less than a refractive index, n2, of the tapered rod integrator. The material in cavity 40 can be, in various embodiments, air (including any of a variety of gases or gas mixtures) or a liquid. The liquid can be an encapsulant gel. In some embodiments, the refractive index n1 will be close to 1.0, but can be as high as 1.5 in yet other exemplary embodiments. Other values of n1 are also possible. Regardless of the value of n1, generally, n1 will be less than n2. In exemplary embodiments, the refractive index n2 of the tapered rod integrator will be at least 2.0, and generally will be around 2.4 or higher.

Figure 2A:
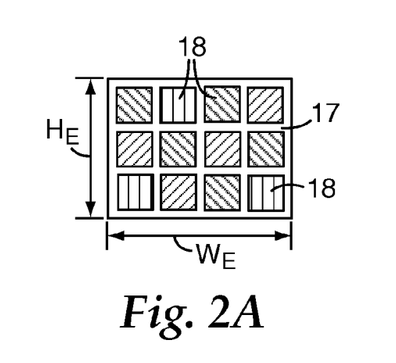
FIG. 2A is a schematic top view illustration of the emitter shown in FIG. 1, illustrating an aspect ratio.

Referring now to FIG. 2A, shown is a schematic top view of emitting surface 17 of emitter 15 in accordance with one example embodiment. In this example embodiment, emitting surface 17 has array of emitters 18, for example emitters of differing colors. For example, in FIG. 2A, array of emitters 18 comprise three different colors (e.g., red, green and blue) each designated by a different cross-hatching. These types of multi-colored emitter arrays can utilize the color blending provided by tapered rod integrator 30. However, use of tapered rod integrator 30 is not limited to emitter arrays, as integrator 30 can be used with single emitters as well.

Figure 2B:
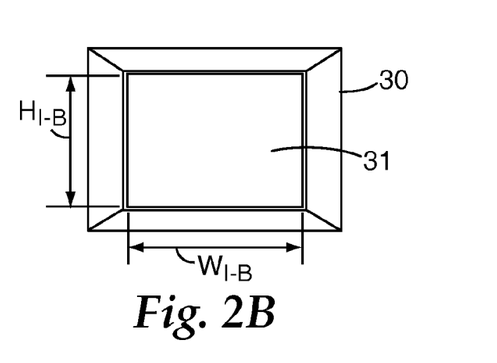
FIGS. 2B and 2C are bottom and top views, respectively, of tapered rod integrators, illustrating aspect ratios.

Emitter 15 has an aspect ratio which is the width $W_E$ of the emitter divided by the height $H_E$ of the emitter. End 35 of tapered rod integrator 30 which provides the spherical shaped cavity 40 also has an aspect ratio. FIG. 2B shows a bottom view of integrator 30 such that cavity 40 is shown. The aspect ratio of integrator 30 at bottom end 35 is the width $W_{I-B}$ of that end of the integrator divided by the height $H_{I-B}$ of that end of the integrator. In some exemplary embodiments, the aspect ratio of integrator 30 at bottom end 35 closely matches the dimensional aspect ratio of the emitter. By closely matching, these aspect ratios can be substantially equal in exemplary embodiments.

Figure 2C:
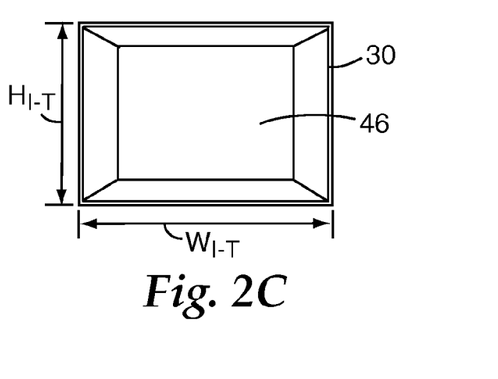

FIG. 2C illustrates a top view of integrator 30 such that cavity top end 45 is shown. The aspect ratio of integrator 30 at top end 45 is the width $W_{I-T}$ of that end of the integrator divided by the height $H_{I-T}$ of that end of the integrator. In some exemplary embodiments, the aspect ratio of integrator 30 at top end 45 is a rectangular aspect ratio (even if the bottom end of integrator 30 is not rectangular). The rectangular aspect ratio of the top end 45 of integrator 30 does not need to closely match the aspect ratios of the emitter and of the bottom end of the integrator. This allows conversion to a desired aspect ratio to be achieved.

Figure 3:
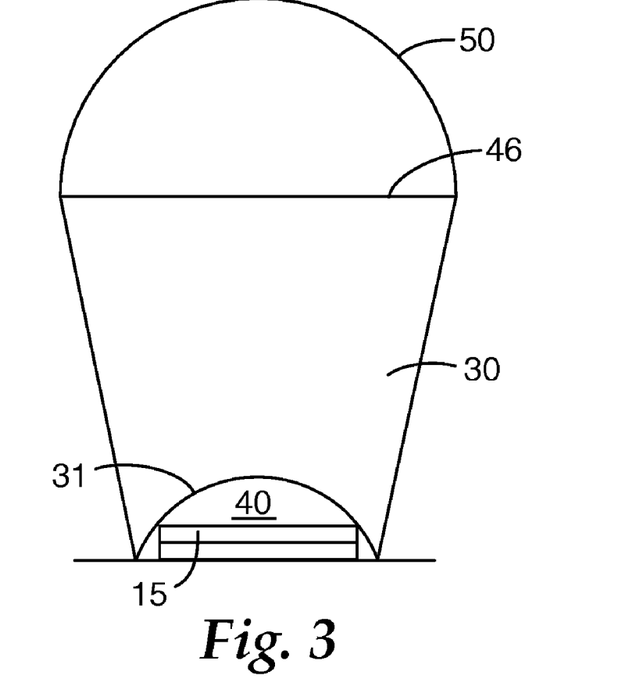
FIGS. 3-6 are schematic side view illustrations of the light source module shown in FIG. 1, and which illustrate additional features and/or components.
Figure 4:
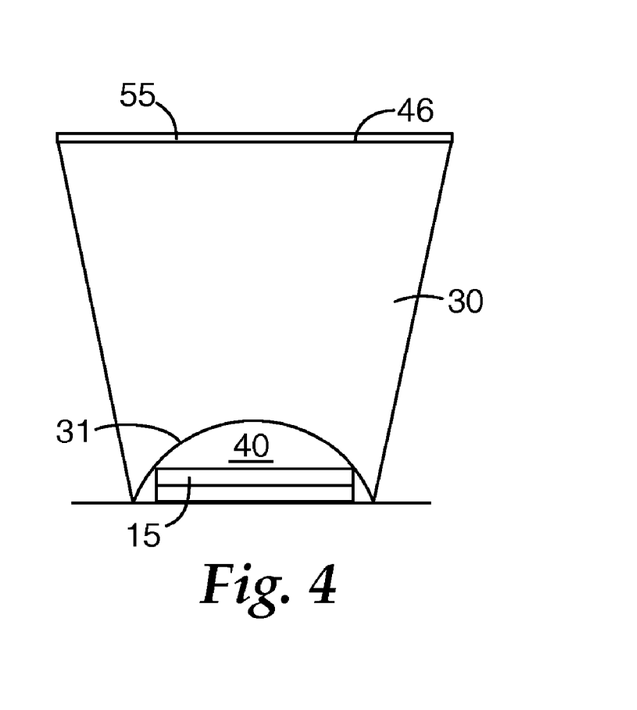
Figure 5:
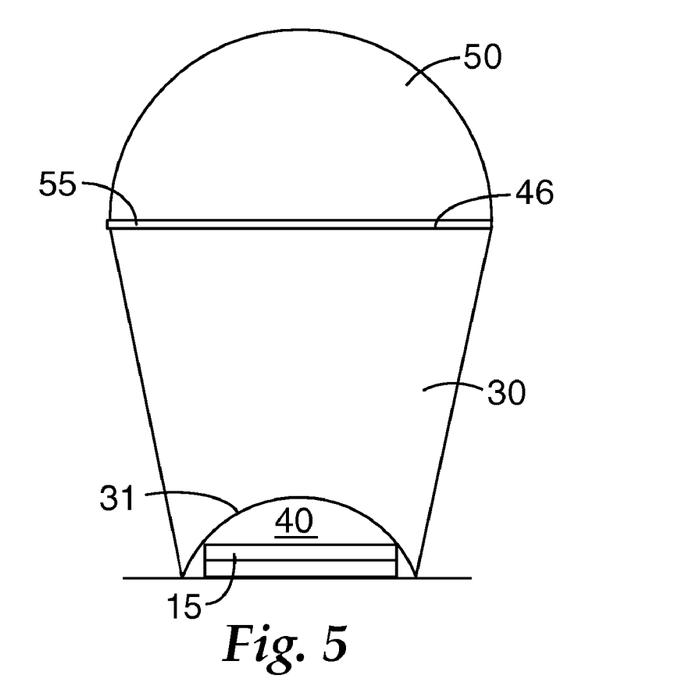
Figure 6:
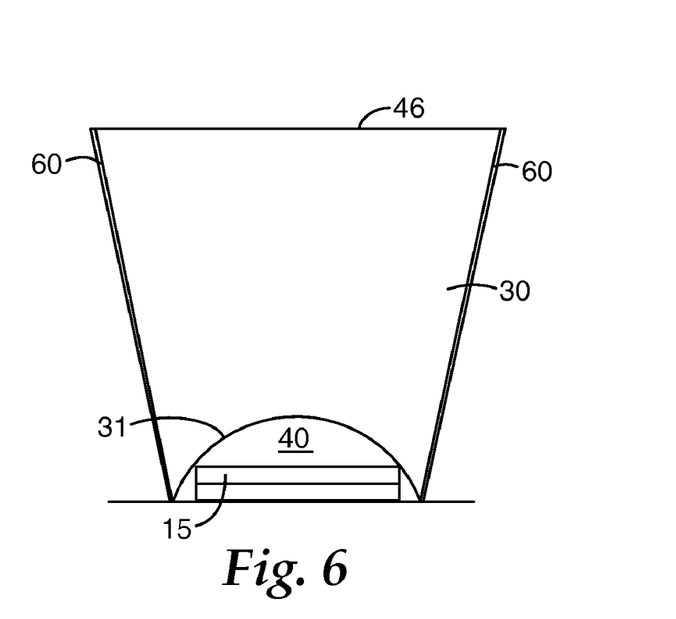

Referring now to FIG. 3, shown is a further embodiment of light source module 10 in which an optic 50 in the form of a collection lens is adhered to the tapered rod integrator. Optic 50 can be any type of optical lens component chosen to achieve a particular result. For example, optic 50 can include a collimating lens to aid in the production of collimated light from source 10. Also, instead of an optical lens, one or several single-layer or multi-layer optical films 55 can be positioned on surface 46 of tapered rod integrator 30 to achieve desired optical results. This is illustrated for example in FIG. 4. An example of an optical film which can be placed on surface 46 includes a reflective polarizing film (RPF) which can be used to produce uniformly polarized light and to facilitate light recycling. An example of a reflective polarizing film is the Vikuiti-brand multi-layer optical film (MOF) DBEF, manufactured by 3M Company, St. Paul, Minn. Another example of an optical film which can be placed on surface 46 is a quarter wave plate (QWP), which can be used to convert the polarization of light (e.g., from circularly polarized to linearly polarized, or vice versa). In one embodiment both RPF and QWP are included in optical film element 55, with the QWP adjacent to surface 46, in order to produce a greater degree of polarized light recycling. In still other embodiments of light source module 10, such as illustrated in FIG. 5, the light source module includes the collection lens or other optic 50 adhered to the tapered rod integrator 30 via it being positioned on optical film 55. In yet another embodiment illustrated in FIG. 6, mirrored sides 60 are formed from reflective materials on the side walls of integrator 30 in order to enhance total internal reflection (TIR) provided by integrator 30 and light source module 10.

Figure 7:
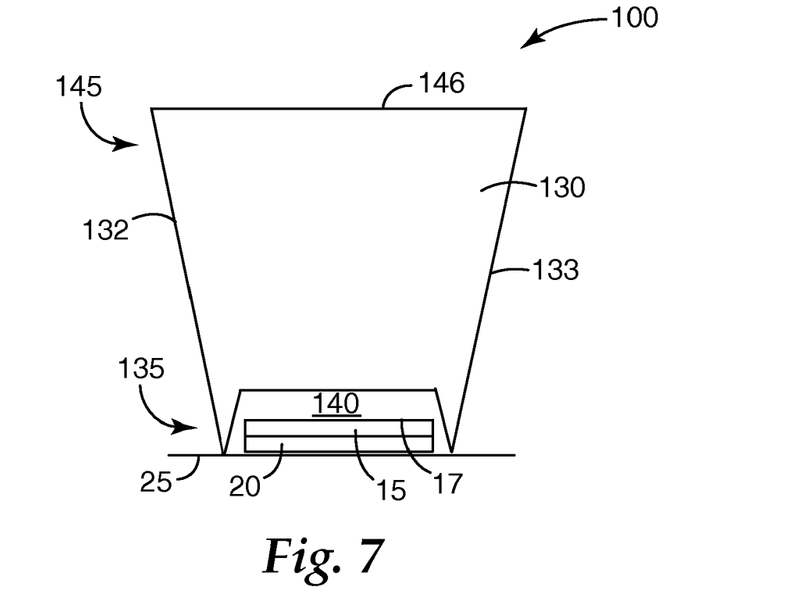
FIG. 7 is a schematic side view illustration of a light source module including a tapered rod integrator in accordance with another disclosed embodiment.
Figure 8:
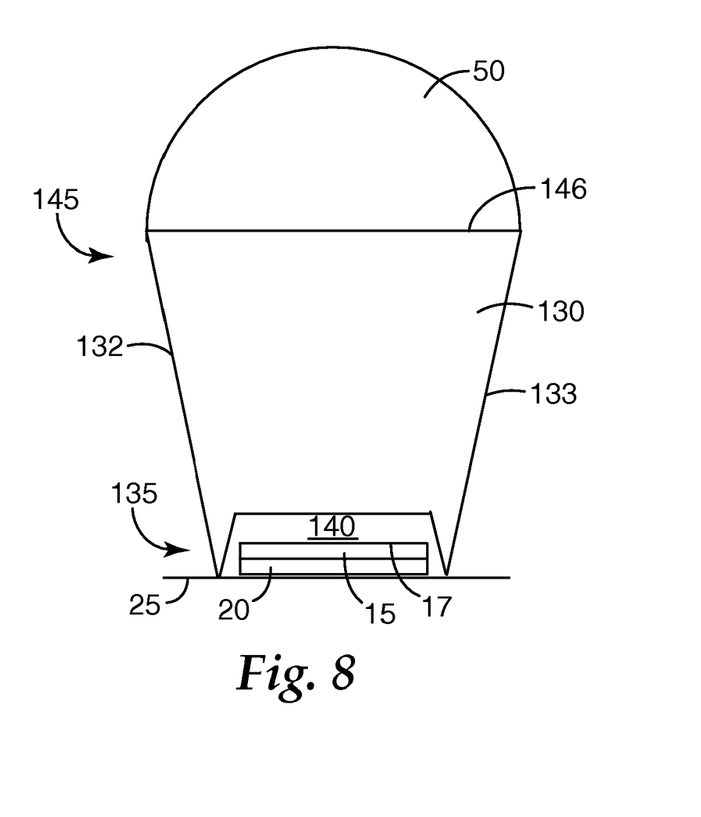
FIGS. 8-11 are schematic side view illustrations of the light source module shown in FIG. 7, and which illustrate additional features and/or components.
Figure 9:
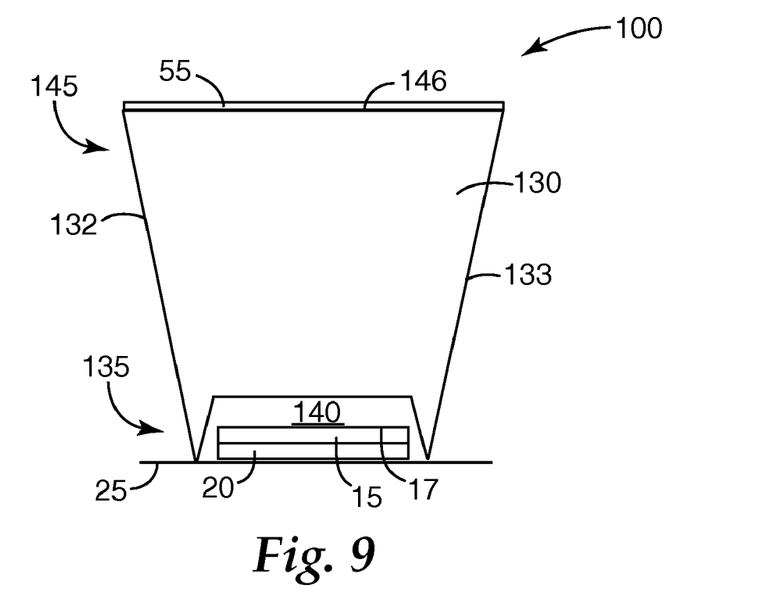
Figure 10:
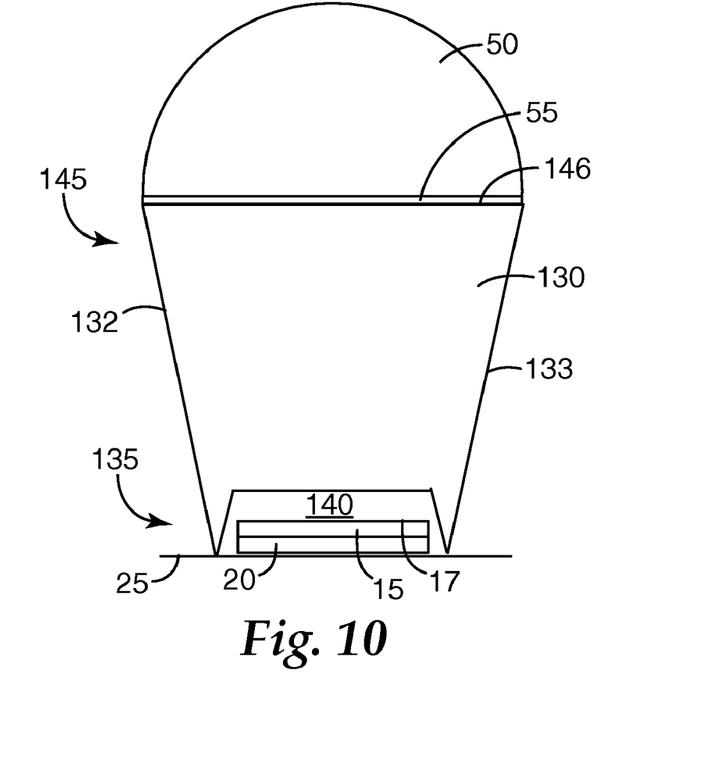
Figure 11:
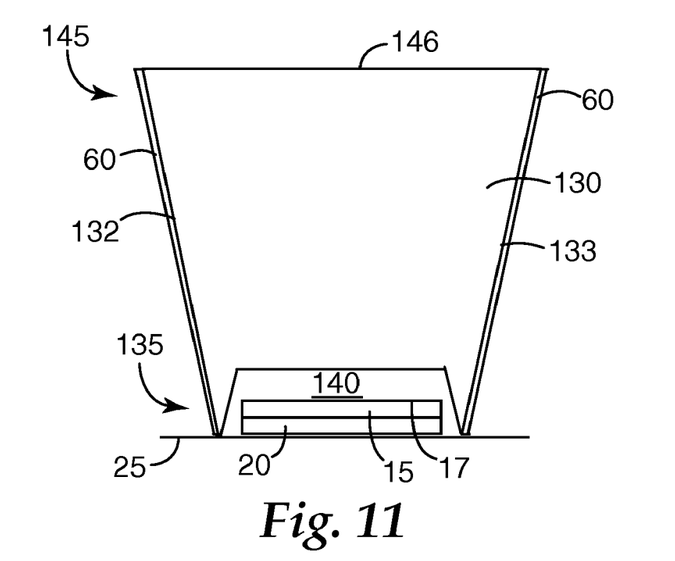

Referring now to FIGS. 7-11, shown is another light source module 100 which is substantially the same as light source module 10, with the exception of certain aspects of the tapered rod integrator. As shown in FIG. 7, light source module 100 includes tapered rod integrator 130 which shares many features with tapered rod integrator 30 described above. As such, tapered rod integrator 130 has a proximal end 135 and a distal end 145. Proximal end 135 faces emitting surface 17, while distal end 145 faces away from the emitting surface. Distal end 145 of integrator 130 provides a surface 146 on which optics and/or optical films can be positioned. Between top surface 146 and the bottom of integrator 130, the integrator 130 has tapered sidewalls 132 and 133. The primary difference between integrators 30 and 130 is that cavity 140, provided by integrator 130 and positioned over the emitting surface, is a truncated pyramidal shaped cavity instead of a spherical shaped cavity. The materials used to fill truncated pyramidal shaped cavity 140 can be the same as discussed above. Similarly, as illustrated in FIGS. 8-11, optics such as collection lens 50, optical films 55, mirrored sides 60, or various combinations of these types of features, can all be used with integrator 130.

Figure 13:
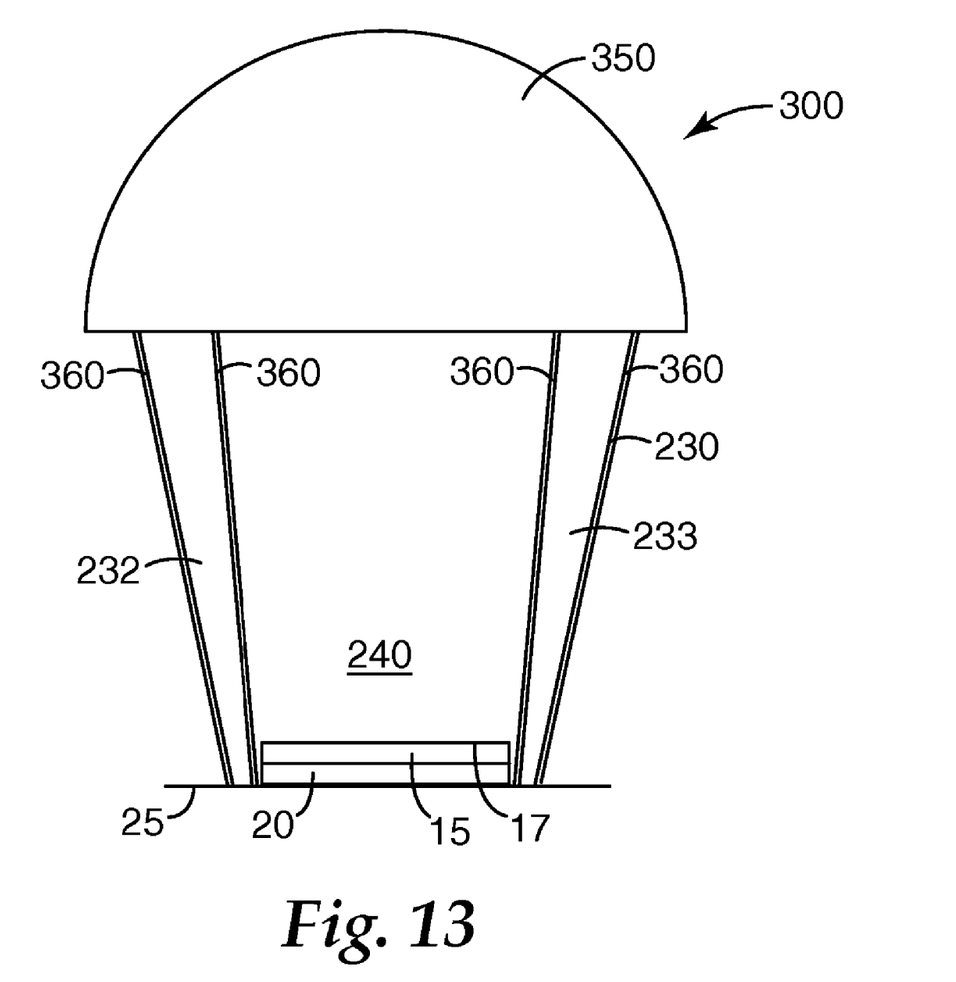
FIG. 13 is a schematic side view illustration of another light source module embodiment including an integrating tunnel type optic.

Yet another embodiment which can be used with these various features is illustrated in FIG. 12. In FIG. 12, light source module 200 is shown having an integrating optic in the form of tunnel integrator 230. In tunnel integrator 230, the cavity 240 is extended upward to form a tunnel through tapered or non-tapered sidewalls 232 and 233. Although not illustrated in FIG. 12, the various features described above with reference to tapered rod integrators 30 and 130 can all be used with tunnel integrator 230 in the same manner. Thus, the sidewalls of tunnel integrator 230 can be mirrored for example. As a further example, one or more optical films can be included with tunnel integrator 230 between the tunnel integrator and collection lens 50. The contents of the cavity (e.g., the tunnel 240) and the refractive index relationship stipulating that the index closest to the emitter is lower than the index of subsequent optics also apply to tunnel integrator 230 embodiments. Further, while a particular collection lens size is shown matching the width of tunnel integrator 230, other sizes of collection lenses can also be used. See e.g., the wider collection lens 350 used with tunnel integrator 230 in light source module 300 shown in FIG. 13. FIG. 13 also illustrates mirrored sidewalls 360, which can be either of inner or outer sidewalls in various embodiments, as was described above with regard to tapered rod integrators.

In summary, in exemplary embodiments, light source modules include an emitter having at least one light emitting surface, and an at least partially hollow integrating optic mounted over the emitting surface. In the various embodiments, the index of refraction within the hollowed area is less then the index of refraction of the subsequent medium along the optical path.

The at least partially hollow integrating optic has a proximal end facing the emitting surface and a distal end facing away from the emitting surface. In some embodiments, the proximal end of the integrating optic has a dimensional aspect ratio closely matching a dimensional aspect ratio of the emitter, while the distal end of the integrating optic is flat with a rectangular aspect ratio. The rectangular aspect ratio of the distal end of the integrating optic can be different than the dimensional aspect ratio of the proximal end of the integrating optic.

In various embodiments, the at least partially hollow integrating optic includes a tapered rod integrator forming a cavity over the emitting surface, where the cavity has a refractive index, n1, less than a refractive index, n2, of the tapered rod integrator. The cavity can be, for example, a spherical or a truncated pyramidal shaped cavity. The cavity can be filed with air, fluid such an encapsulant gel, etc, thus providing the refractive index n1. A collection lens can be adhered to the tapered rod integrator, and the collection lens will have a refractive index which is higher than the refractive index, n2, of the tapered rod integrator. One or more optical films can also be positioned between the collection lens and a distal end of the tapered rod integrator.

In yet other embodiments, the at least partially hollow integrating optic includes a tunnel integrator mounted over the emitting surface. In these embodiments, the light source modules will typically include a collection lens adhered to the tunnel integrator having an index of refraction, n2, greater than the index of refraction, n1, in the tunnel. In the exemplary embodiments illustrated, the tunnel integrator has a proximal end facing the emitting surface and a distal end facing away from the emitting surface, the proximal end of the tunnel integrator forms an enclosure over the emitting surface, while the distal end of the tunnel integrator is flat with a rectangular aspect ratio. The collection lens is typically adhered to the distal end of the tunnel integrator.

The disclosed light source modules can be used in a variety of devices. In exemplary embodiments, a color-sequential mini-projector utilizing these light source modules can include the light source modules, a polarizing beam splitter (PBS), a monochrome liquid crystal on silicon (LCOS) panel, and a projection lens. There would not be the need for a color-combining X-cube since the colors would be combined and homogenized in the tapered tunnel extractor. In addition, there would not be a need for an anamorphic lens to adjust the aspect ratio, provided the LED array and tapered tunnel aspect ratios matched that of the desired imager panel. A color-filter mini-projector employing the disclosed light source modules can include a PBS, a color-filter LCOS panel, and a projection lens. Alternatively, a color-sequential mini-projector system utilizing these light source modules can include the light source modules, collimating optics, a digital light processing (DLP) panel, and a projection lens.

Unless otherwise indicated, all numbers expressing feature sizes, amounts, and physical properties used in the specification and claims are to be understood as being modified by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

Various modifications and alterations of this invention will be apparent to those skilled in the art without departing from the scope and spirit of this invention, and it should be understood that this invention is not limited to the illustrative embodiments set forth herein. All U.S. patents, patent application publications, and other patent and non-patent documents referred to herein are incorporated by reference in their entireties, except to the extent any subject matter therein is inconsistent with the foregoing disclosure.

What is claimed is:

1. A light source module, comprising:
    an emitter having at least one light emitting surface; and
    an at least partially hollow integrating optic mounted over the emitting surface;
    wherein the index of refraction within the hollowed area is less then the index of refraction of the subsequent medium along the optical path; and
    wherein the at least partially hollow integrating optic has a proximal end facing the emitting surface and a distal end facing away from the emitting surface, the proximal end of the at least partially hollow integrating optic having a dimensional aspect ratio closely matching a dimensional aspect ratio of the emitter, the distal end of the at least partially hollow integrating optic being flat with a rectangular aspect ratio.

2. The light source module of claim 1, wherein the rectangular aspect ratio of the distal end of the at least partially hollow integrating optic is different than the dimensional aspect ratio of the proximal end of the at least partially hollow integrating optic.

3. The light source module of claim 1, wherein the at least partially hollow integrating optic comprises a tapered rod integrator forming a cavity over the emitting surface, wherein the cavity has a refractive index, n1, less than a refractive index, n2, of the tapered rod integrator.

4. The light source module of claim 3, wherein the cavity of the tapered rod integrator is a spherical cavity.

5. The light source module of claim 3, wherein the cavity of the tapered rod integrator is a truncated pyramidal shaped cavity.

6. The light source module of claim 3, wherein the cavity of the tapered rod integrator is filled with air which has the refractive index n1.

7. The light source module of claim 3, wherein the cavity of the tapered rod integrator is filled with a liquid having the refractive index n1.

8. The light source module of claim 7, wherein the liquid is an encapsulant gel.

9. The light source module of claim 3, and further comprising a collection lens adhered to the tapered rod integrator, the collection lens have a refractive index which is higher than the refractive index, n2, of the tapered rod integrator.

10. The light source module of claim 9, and further comprising at least one optical film positioned between the collection lens and a distal end of the tapered rod integrator.

11. The light source module of claim 3, wherein the tapered rod integrator has a proximal end facing the emitting surface and a distal end facing away from the emitting surface, the light source module further comprising at least one optical film adhered to a distal end of the tapered rod integrator.

12. The light source module of claim 1, wherein the at least partially hollow integrating optic comprises a tunnel integrator mounted over the emitting surface, the light source module further comprising:
    a collection lens adhered to the tunnel integrator having an index of refraction, n2, greater than the index of refraction, n1, in the tunnel;
    wherein said tunnel integrator has a proximal end facing the emitting surface and a distal end facing away from the emitting surface, the proximal end of the tunnel integrator forming an enclosure over the emitting surface, the distal end of the tunnel integrator being flat with a rectangular aspect ratio, the collection lens being adhered to the distal end of the tunnel integrator.

13. The light source module of claim 12, wherein the tunnel integrator has tapered side walls.

14. The light source module of claim 12, wherein the proximal end of the tunnel integrator has a dimensional aspect ratio closely matching a dimensional aspect ratio of the emitting surface.

15. The light source module of claim 14, wherein the rectangular aspect ratio of the distal end of the tunnel integrator is different than the dimensional aspect ratio of the proximal end of the tunnel integrator.

16. The light source module of claim 12, wherein the tunnel integrator is filled with air which has the refractive index n1.

17. The light source module of claim 12, wherein the tunnel integrator is filled with a liquid having the refractive index n1.

18. The light source module of claim 17, wherein the liquid is an encapsulant gel.

19. The light source module of claim 12, and further comprising at least one optical film positioned between the collection lens and the distal end of the tunnel integrator.

20. The light source module of claim 1, wherein the at least partially hollow integrating optic has mirrored side walls between a proximal end facing the emitting surface and a distal end facing away from the emitting surface.

* * * * *